United States Patent
Lei et al.

(10) Patent No.: US 8,765,601 B2
(45) Date of Patent: *Jul. 1, 2014

(54) POST DEPOSITION TREATMENTS FOR CVD COBALT FILMS

(71) Applicant: Applied Materials, Inc., Santa Clara, CA (US)

(72) Inventors: Yu Lei, Belmont, CA (US); Xinyu Fu, Pleasanton, CA (US); Anantha Subramani, San Jose, CA (US); Seshadri Ganguli, Sunnyvale, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/956,969

(22) Filed: Aug. 1, 2013

(65) Prior Publication Data

US 2014/0011354 A1 Jan. 9, 2014

Related U.S. Application Data

(63) Continuation of application No. 13/174,692, filed on Jun. 30, 2011, now Pat. No. 8,524,600.

(60) Provisional application No. 61/470,386, filed on Mar. 31, 2011.

(51) Int. Cl.
*H01L 21/283* (2006.01)
*B82Y 40/00* (2011.01)

(52) U.S. Cl.
USPC ................ 438/653; 977/755; 257/E21.159

(58) Field of Classification Search
None
See application file for complete search history.

(56) References Cited

U.S. PATENT DOCUMENTS

| | | | |
|---|---|---|---|
| 6,537,733 B2 | 3/2003 | Campana et al. | |
| 6,790,788 B2 | 9/2004 | Li et al. | |
| 6,878,206 B2 | 4/2005 | Tzu et al. | |
| 6,890,850 B2 | 5/2005 | Lee et al. | |
| 6,916,398 B2 | 7/2005 | Chen et al. | |
| 7,204,886 B2 | 4/2007 | Chen et al. | |
| 7,264,846 B2 | 9/2007 | Chang et al. | |
| 7,404,985 B2 | 7/2008 | Chang et al. | |
| 7,682,946 B2 | 3/2010 | Ma et al. | |
| 7,780,785 B2 | 8/2010 | Chen et al. | |
| 7,850,779 B2 | 12/2010 | Ma et al. | |
| 8,110,489 B2 | 2/2012 | Ganguli et al. | |
| 8,524,600 B2 * | 9/2013 | Lei et al. | 438/653 |
| 2007/0202254 A1 | 8/2007 | Ganguli et al. | |
| 2008/0135914 A1 | 6/2008 | Krishna et al. | |
| 2009/0004850 A1 | 1/2009 | Ganguli et al. | |
| 2009/0053426 A1 | 2/2009 | Lu et al. | |
| 2009/0269507 A1 | 10/2009 | Yu et al. | |

* cited by examiner

*Primary Examiner* — Seahvosh Nikmanesh
(74) *Attorney, Agent, or Firm* — Patterson & Sheridan, LLP

(57) ABSTRACT

Embodiments of the invention provide methods for forming materials on a substrate used for metal gate and other applications. In one embodiment, a method includes forming a cobalt stack over a barrier layer disposed on a substrate by depositing a cobalt layer during a deposition process, exposing the cobalt layer to a plasma to form a plasma-treated cobalt layer during a plasma process, and repeating the cobalt deposition process and the plasma process to form the cobalt stack containing a plurality of plasma-treated cobalt layers. The method further includes exposing the cobalt stack to an oxygen source gas to form a cobalt oxide layer from an upper portion of the cobalt stack during a surface oxidation process and heating the remaining portion of the cobalt stack to a temperature within a range from about 300° C. to about 500° C. to form a crystalline cobalt film during a thermal annealing crystallization process.

20 Claims, 3 Drawing Sheets (FROM 2E)

POST DEPOSITION TREATMENTS FOR CVD COBALT FILMS

CROSS-REFERENCE TO RELATED APPLICATIONS

This application is a continuation of co-pending U.S. patent application Ser. No. 13/174,692, filed Jun. 30, 2011, which claims benefit of U.S. provisional patent application Ser. No. 61/470,386, filed Mar. 31, 2011. Each of the aforementioned related patent applications are herein incorporated by reference in their entirety.

BACKGROUND OF THE INVENTION

1. Field of the Invention

Embodiments of the invention generally relate to a metallization process for manufacturing electronic and semiconductor devices, more particularly, embodiments relate to methods for depositing and treating cobalt films on a substrate.

2. Description of the Related Art

Currently, cobalt is a metal of choice for use in multilevel metallization processes that are crucial to device manufacturing, especially for the PMOS work function layers of metal-oxide-semiconductor field-effect transistor (MOSFET) as well as wetting layer for direct metal gap fill. The multilevel interconnect features that drive the manufacturing processes have high aspect ratio apertures including contacts, vias, lines, gaps, and other features. Filling these features without creating voids or deforming the feature geometry is more difficult when the features have higher aspect ratios. Reliable formation of interconnects is also more difficult as manufacturers strive to increase circuit density and quality.

As the use of cobalt has permeated the marketplace due of a relative low cost and processing properties, manufacturers of semiconductor, solar, and other electronic devices continue to look for ways to increase conductivity while improving surface roughness of the cobalt layer and improving the boundary regions between cobalt and other material layers by reducing cobalt diffusion and agglomeration. Several processing methods have been developed to manufacture interconnects containing cobalt as feature sizes have decreased. Each processing method may increase the likelihood of problematic issues such as cobalt conductivity, cobalt crystalline structure deformation, and agglomeration. Physical vapor deposition (PVD), chemical vapor deposition (CVD), atomic layer deposition (ALD), electrochemical plating (ECP), electroless deposition, and other deposition techniques have been utilized for depositing cobalt materials and layers, however, such cobalt layers generally suffer with the aforementioned issues.

A cobalt layer deposited by a CVD or ALD process generally has greater electrical resistivity relative to a similar cobalt layer deposited by a PVD process. Generally, the greater resistivity is due in part to a significant carbon content (e.g., about 5 atomic percent) as well as a high surface roughness of the thin cobalt layer deposited by a CVD or ALD process. Such high carbon contents and surface roughness significantly impact the work function of the cobalt layer as a p-type metal and generally causes a high resistance of the overall integrated gate stack or other device the cobalt layer is contained therein. Cobalt layers deposited by PVD are often non-conformal and have other irregularities that affect device performance and stability. Also, high aspect ratio features usually develop voids during the deposition of cobalt materials by PVD or CVD. Non-vapor deposition processes for cobalt, such as ECP and electroless, generally require exposing the substrate and all layers thereon to a liquid bath, such as an aqueous solution, while depositing the cobalt layer thereon. Also, the cobalt layers deposited by ECP and electroless deposition processes may often have relative high resistivity and poor conformal films.

Therefore, a need exists for a method for forming cobalt layers, films, and materials and for devices containing such cobalt layers, films, and materials.

SUMMARY OF THE INVENTION

Embodiments of the invention provide methods for forming and treating materials on a substrate used for metal gate and other applications. In one embodiment, a method for depositing materials on a substrate surface is provided and includes forming a cobalt stack on or over a barrier layer disposed on a substrate by depositing a cobalt layer during a deposition process, exposing the cobalt layer to a plasma to form a plasma-treated cobalt layer during a plasma process, and repeating the cobalt deposition process and the plasma treatment process to form the cobalt stack containing a plurality of plasma-treated cobalt layers. The method further includes exposing the cobalt stack to an oxygen source gas to form a cobalt oxide layer from an upper portion of the cobalt stack during a surface oxidation process and heating the remaining portion of the cobalt stack to a crystallization temperature within a range from about 300° C. to about 500° C. during a thermal annealing crystallization process to form a crystalline cobalt film from the remaining portion of the cobalt stack.

The cobalt oxide layer is usually maintained disposed on the cobalt stack during the thermal annealing crystallization process in order to prevent or substantially prevent agglomeration of the cobalt material within the cobalt stack. In some examples, the crystallization temperature may be within a range from about 300° C. to about 425° C., such as from about 375° C. to about 425° C. The cobalt stack disposed on or over the substrate may be heated at the crystallization temperature for a time period within a range from about 5 minutes to about 60 minutes, such as about 30 minutes, during the thermal annealing crystallization process.

In another embodiment, a method for depositing materials on the substrate surface is provided and includes forming the cobalt stack containing the plurality of plasma-treated cobalt layers over the barrier layer disposed on the substrate by sequentially depositing and treating cobalt layers, wherein each cobalt layer is deposited during a thermal CVD process and subsequently exposed to a plasma to form each of the plasma-treated cobalt layers during a plasma process. The plasma-treated cobalt layers have a significantly reduced surface roughness relative to the non-treated, deposited cobalt layers. Each cobalt layer may be deposited or formed from a deposition gas containing a cobalt source gas and hydrogen gas ($H_2$) during the thermal CVD process.

In some examples, the cobalt stack disposed on or over the substrate may be maintained at or heated to a temperature within a range from about 200° C. to about 500° C., such as from about 250° C. to about 350° C., for a time period of about 60 seconds or less, such as within a range from about 5 seconds to about 60 seconds during the surface oxidation process, such as a flash oxidation process. In other examples of the surface oxidation process, the cobalt stack disposed on or over the substrate may be exposed to the air and maintained at ambient temperature or room temperature (about 18° C.-25° C., for example, about 20° C.) or heated to a temperature within a range from about 20° C. to about 500° C. The oxygen source gas may contain an oxygen source compound selected from oxygen gas ($O_2$), air, enriched air, atomic oxygen (O), ozone, nitrous oxide, nitric oxide, water vapor, derivatives thereof, plasmas thereof, or combinations thereof. The cobalt oxide layer may have a thickness within a range from about 5 Å to about 30 Å, such as from about 10 Å to about 20 Å, for example, about 15 Å.

The cobalt oxide layers described herein contain cobalt oxide materials which are electrically conducting materials. These cobalt oxide materials usually have a greater resistivity compared to the resistivity of metallic cobalt. For example, a cobalt oxide layer of about 100 Å may have a resistivity within a range from about 1 Ω-cm to about 10 Ω-cm, while a metallic cobalt layer of about 100 Å may have a resistivity within a range from about 20 μΩ-cm to about 40 μΩ-cm. In some embodiments, the resistivity of the cobalt oxide materials contained within the cobalt oxide layer is desirable or acceptable for certain applications including some high gate stack applications. Therefore, in some embodiments, a contact film may be directly deposited, plated, or otherwise formed on or over the silicon oxide layer. However, in other applications, the cobalt oxide materials contained within the cobalt oxide layer may cause undesirable or unacceptable resistance within a high gate stack. Therefore, in other embodiments described herein, the cobalt oxide layer may be exposed to at least one treatment process or other process to remove, disrupt or interrupt, breech, and/or otherwise break or separate the cobalt oxide material contained within the cobalt oxide layer prior to depositing the contact film.

In one embodiment, the cobalt oxide layer may be exposed to a reducing plasma or agent to form a metallic cobalt layer by chemically reducing the cobalt oxide material to metallic cobalt during an optional step of the process. In some examples, the cobalt oxide layer may be exposed to a hydrogen plasma during a plasma treatment process. The hydrogen plasma may be ignited, generated, or otherwise formed at a frequency of 40 MHz by a VHF RF plasma generator.

In another embodiment, a conductive metallic layer may be deposited, plated, or otherwise formed on or over the cobalt oxide layer disposed over the crystalline cobalt film during another optional step of the process. The conductive metallic layer may contain a metal such as aluminum, copper, titanium, alloys thereof, or combinations thereof. Subsequently, the conductive metallic layer contained on the substrate may be heated to a predetermined temperature while metal from the conductive metallic layer diffuses into the cobalt oxide layer and the crystalline cobalt film during a thermal annealing process. The diffused metal from the conductive metallic layer reduces the resistivity of the cobalt oxide layer and the crystalline cobalt film. During the thermal annealing process, the conductive metallic layer may be heated to a temperature within a range from about 200° C. to about 600° C. The metal of the conductive metallic layer may reflow to form void-free gap fill during the thermal annealing process.

In some examples, each of the cobalt layers may be deposited from a deposition gas containing a cobalt source gas and hydrogen gas during a thermal CVD process. The substrate may be heated to a temperature within a range from about 50° C. to about 400° C., such as from about 100° C. to about 250° C., during the thermal CVD process. In one example, the cobalt source gas contains dicobalt hexacarbonyl butylacetylene (CCTBA). Each of the cobalt layers may be exposed to the plasma to form the plasma-treated cobalt layers during a plasma treatment process. The plasma is generally a reducing plasma and may contain or be formed of a reagent, such as ammonia ($NH_3$), hydrogen ($H_2$), hydrazine ($N_2H_4$), diazene ($N_2H_2$), an ammonia/hydrogen mixture, derivatives thereof, or combinations thereof. In some examples, each cobalt layer may be exposed to the hydrogen plasma for a time period within a range from about 10 seconds to about 180 seconds, such as from about 10 seconds to about 90 seconds, such as from about 30 seconds to about 90 seconds, during the plasma treatment process post each cycle of the deposition process, such as the thermal CVD process.

Examples provide that the cobalt stack may generally have a carbon concentration of about 3 at % (atomic weight percent) or less. In some examples, the cobalt stack may have a thickness within a range from about 80 Å to about 120 Å and a resistivity within a range from about 20 μΩ-cm to about 40 μΩ-cm. In one example, the cobalt stack has a thickness of about 100 Å and a resistivity of about 30 μΩ-cm. In other examples, the cobalt stack may have a thickness within a range from about 450 Å to about 750 Å and a resistivity within a range from about 5 μΩ-cm to about 20 μΩ-cm. In one example, the cobalt stack has a thickness of about 600 Å and a resistivity of about 12 μΩ-cm.

In some examples, the cobalt stack contains a single plasma-treated cobalt layer. In many examples, the cobalt stack contains 2 or more plasma-treated cobalt layer. For example, the plurality of plasma-treated cobalt layers within the cobalt stack may contain at least 3 plasma-treated cobalt layers and may contain up to about 30 plasma-treated cobalt layers. In other examples, the cobalt stack contains more than 30 plasma-treated cobalt layers. For example, the cobalt stack may contain a single plasma-treated cobalt layer and have a thickness of about 20 Å, while in other examples, the cobalt stack may contain 3 plasma-treated cobalt layers and have a thickness of about 60 Å or contain 5 plasma-treated cobalt layers and have a thickness of about 100 Å.

The plasma treatment process may be utilized to smooth or reduce the surface roughness of the cobalt layers so that the plasma-treated cobalt layers have less surface roughness than non-treated, deposited cobalt layers. A cobalt stack containing plasma-treated cobalt layers generally has a surface roughness of at least 20% less than the surface roughness of a cobalt stack containing non-treated cobalt layers which have not been exposed to the plasma treatment process. In one comparative example, a cobalt stack containing 5 plasma-treated cobalt layers has a thickness of about 100 Å and a surface roughness of about 1.1 nm, while a cobalt stack containing 5 non-treated cobalt layers has a thickness of about 100 Å and a surface roughness of about 1.5 nm. Thus, the cobalt stack containing plasma-treated cobalt layers has a surface roughness of about 27% less than the surface roughness of the cobalt stack containing non-treated cobalt layers.

A contact film, such as a gate contact film, may be deposited, plated, or otherwise formed on or over the silicon oxide layer subsequent the flash oxidation process and the thermal annealing crystallization process. The contact film contains a conductive material such as a contact metal that includes copper, aluminum, tungsten, titanium, alloys thereof, or combinations thereof. In some examples, the contact film may contain a seed layer and a bulk layer. Alternatively, the conductive materials of the contact film may be directly deposited on the cobalt stack, the cobalt layer, the plasma-treated cobalt layer, the cobalt oxide layer, the crystalline cobalt film, or the metallic cobalt layer, such as by an ECP process.

In many embodiments described herein, the plasma generated during the plasma treatment process, as well as during other plasma processes, is generated by a VHF RF plasma generator at a frequency of 40 MHz. Such VHF plasma has been utilized to achieve many improvements over other plasma treatment processes conducted with RF plasma at frequencies outside of the VHF range, such as at a frequency of 13.56 MHz. The plasma-treated cobalt layers, the cobalt stacks, the crystalline cobalt films, the metallic cobalt layers, and other materials formed by processes utilizing the VHF plasma as described herein have a reduction in resistivity, surface roughness, carbon content, and plasma damage relative to similar materials formed by processes relying on RF plasma at a frequency outside of the VHF range.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide methods for forming and treating materials on a substrate used for metal gate applications and other semiconductor, solar, or electronic device applications. In one embodiment, a method for depositing materials on a substrate surface is provided and includes forming a cobalt stack on or over a barrier layer disposed on a substrate by depositing a cobalt layer during a deposition process, exposing the cobalt layer to a plasma to form a plasma-treated cobalt layer during a plasma process, and repeating the cobalt deposition process and the plasma treatment process to form the cobalt stack. Generally, the cobalt stack contains a plurality of plasma-treated cobalt layers, but alternatively, the cobalt deposition process and the plasma treatment process may be performed once to form a single plasma-treated cobalt layer as the cobalt stack.

The method further includes exposing the cobalt stack to an oxygen source gas to form a cobalt oxide layer from an upper portion of the cobalt stack during a surface oxidation process. The method also includes heating the remaining portion of the cobalt stack contained on the substrate to a crystallization temperature during a thermal annealing crystallization process to form a crystalline cobalt film from the remaining cobalt stack. Subsequently, in various embodiments described herein, a contact film may be deposited, plated, or otherwise formed on or over the cobalt oxide layer, a metallic cobalt layer, the crystalline cobalt film, the cobalt stack, or a variant thereof disposed on the substrate.

Figure 1:
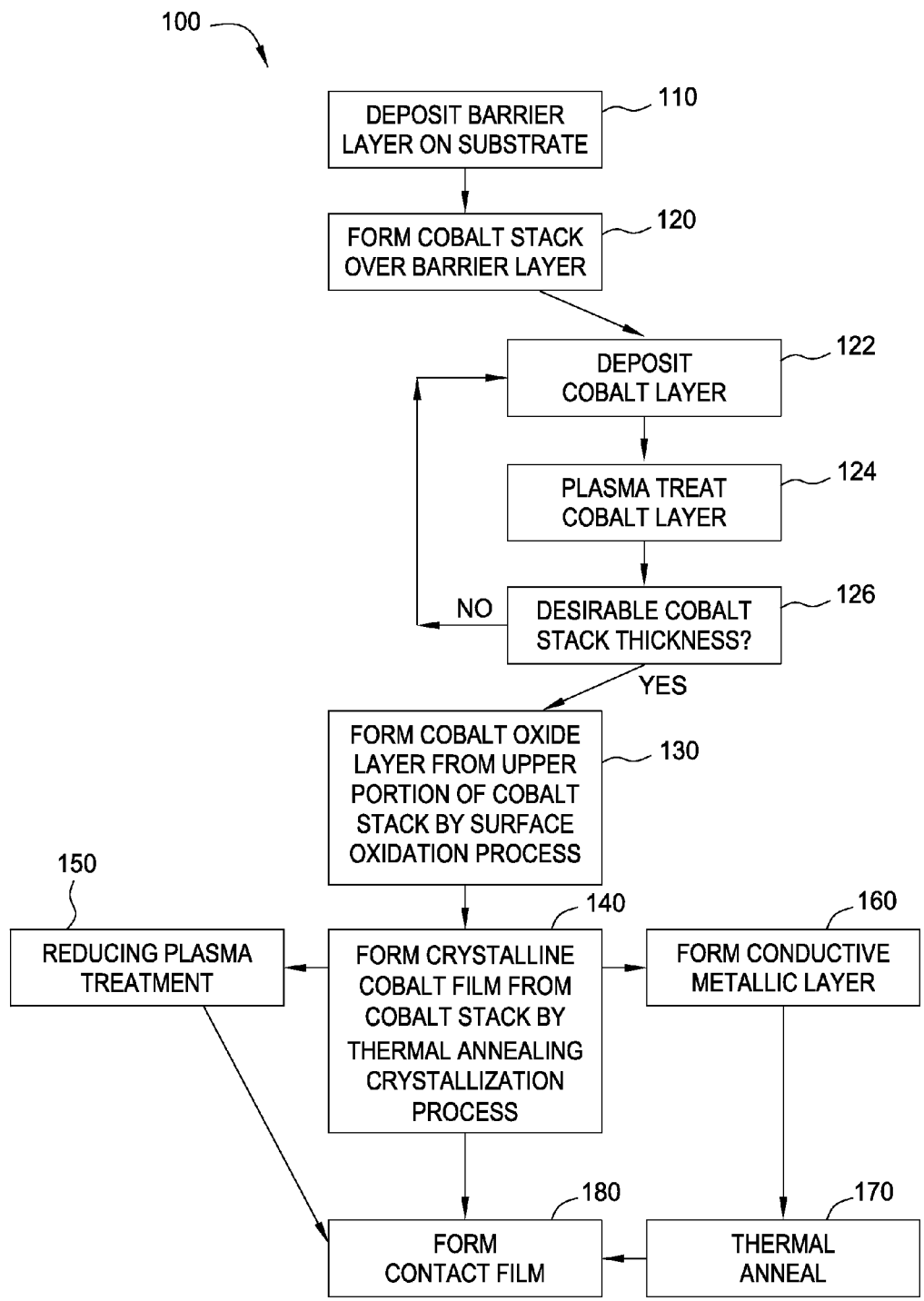
FIG. 1 depicts a flow chart illustrating a process according to embodiments described herein.
Figure 2A:
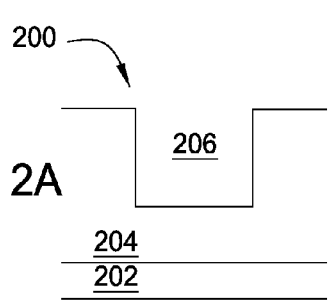
FIGS. 2A-2J depict schematic views of substrates at different process steps according to various embodiments described herein.
Figure 2B:
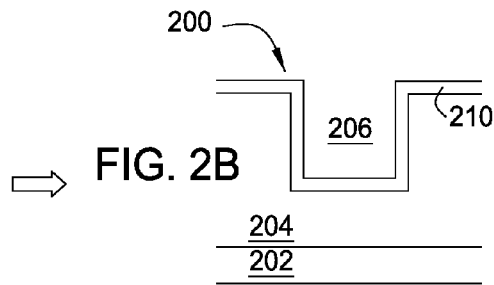
Figure 2C:
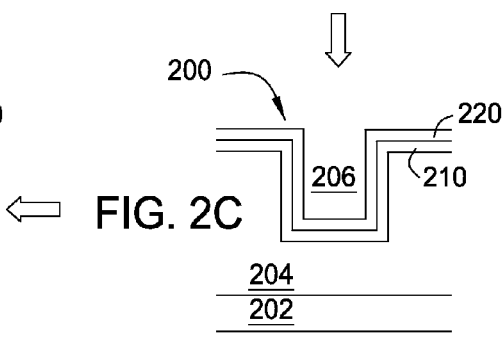
Figure 2D:
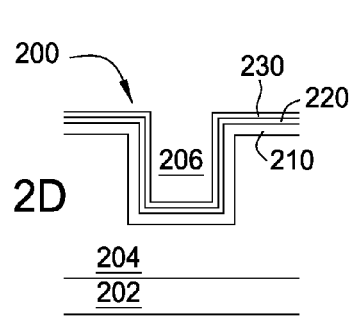

FIG. 1 is a flowchart illustrating process 100 which may be utilized for fabricating or manufacturing devices or otherwise forming various materials in interconnects or other devices, as described by embodiments herein. Process 100 includes various steps 110-180 which may be conducted or performed while forming substrate 200, which is depicted in FIGS. 2A-2J at different stages of process 100. FIGS. 2F, 2H, and 2J depict several different examples of substrate 200 upon completing several variations of process 100, as described by embodiments herein. In one embodiment, process 100 includes depositing or otherwise forming barrier layer 210 on substrate 200 (step 110), forming cobalt stack 220 on or over barrier layer 210 (step 120), forming cobalt oxide layer 230 from an upper portion of cobalt stack 220 during an oxidation process (step 130), forming crystalline cobalt film 240 from the remaining portion of cobalt stack 220 during a thermal annealing crystallization process (step 140), as depicted in FIGS. 1 and 2A-2E.

Upon completing thermal annealing crystallization process at step 140, several different process sequences may optionally be performed during process 100. In one embodiment, contact film 280 may be deposited, plated, or otherwise formed on or over cobalt oxide layer 230 disposed on crystalline cobalt film 240 at step 180 immediately after step 140, as depicted in FIGS. 2E-2F.

Figure 2E:
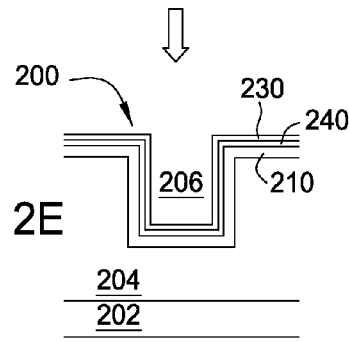
Figure 2F:
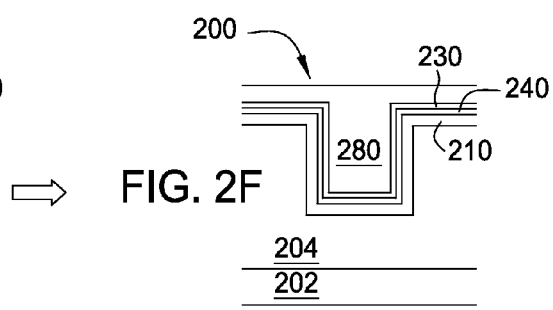
Figure 2G:
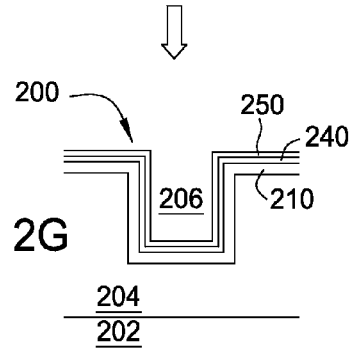
Figure 2H:
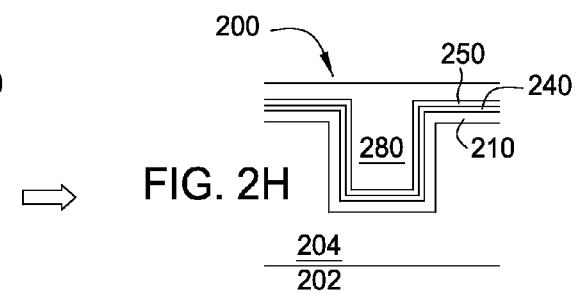

In another embodiment, subsequent to step 140, step 150 may be conducted during process 100 by forming metallic cobalt layer 250 from cobalt oxide layer 230 during a reducing plasma treatment, such as a hydrogen plasma treatment, and then conducting step 180 by depositing, plating, or otherwise forming contact film 280 on or over metallic cobalt layer 250, as depicted in FIGS. 2E and 2G-2H.

Figure 2I:
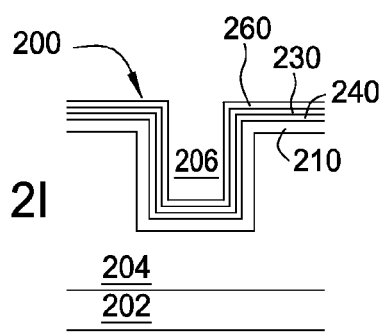
Figure 2J:
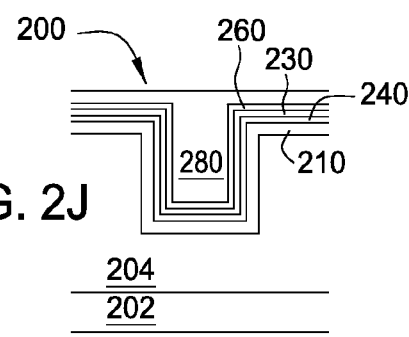

In another embodiment, subsequent to step 140, step 160 may be conducted during process 100 by depositing, plating, or otherwise forming conductive metallic layer 260 on or over cobalt oxide layer 230 disposed on crystalline cobalt film 240, and then conducting step 170 by heating conductive metallic layer 260 during a thermal annealing process to diffuse metal into cobalt oxide layer 230 and crystalline cobalt film 240 from conductive metallic layer 260, and thereafter, conducting step 180 by depositing, plating, or otherwise forming contact film 280 on or over any remaining conductive metallic layer 260, cobalt oxide layer 230, doped variants of cobalt oxide layer 230, crystalline cobalt film 240, and/or doped variants of crystalline cobalt film 240, as depicted in FIGS. 2E and 2I-2J.

FIG. 2A depicts substrate 200 containing dielectric layer 204 disposed over underlayer 202. Aperture 206 is formed within dielectric layer 204 and may be a via, damascene, trough, or other passageway formed therein. Underlayer 202 may be a substrate or wafer, a substrate or wafer surface, a contact layer, an electrode, or another layer depending on the specific device structure. Dielectric layer 204 may contain a dielectric material, such as a low-k dielectric material. In one example, dielectric layer 204 contains a low-k dielectric material, such as a silicon carbide oxide material, or a carbon doped silicon oxide material, for example, BLACK DIAMOND® II low-k dielectric material, available from Applied Materials, Inc., located in Santa Clara, Calif. Another example of a suitable material for dielectric layer 204 is a silicon carbide based film formed using chemical vapor deposition (CVD) or plasma enhanced CVD (PE-CVD) processes such as described in commonly assigned U.S. Pat. Nos. 6,537,733, 6,790,788, and 6,890,850, which are incorporated herein by reference.

In one embodiment, at least one barrier layer or material may be deposited or otherwise formed on or over a substrate during step 110 of process 100. In one example, FIG. 2B depicts barrier layer 210 disposed on or over substrate 200, over dielectric layer 204, and conformally within aperture 206. Barrier layer 210 may contain one layer or multiple layers and each layer may contain at least one material selected from titanium, titanium nitride, tantalum, tantalum nitride, tungsten, tungsten nitride, silicides thereof, derivatives thereof, or combinations thereof. In some embodiments, barrier layer 210 may contain a bilayer of tantalum/tantalum nitride, titanium/titanium nitride, or tungsten/tungsten nitride. Barrier layer 210 may have a thickness within a range from about 5 Å to about 50 Å, such as from about 10 Å to about 30 Å, and may be formed or deposited by PVD, ALD, plasma enhanced ALD (PE-ALD), CVD, PE-CVD, pulsed-CVD, or combinations thereof.

In one example, barrier layer 210 contains a lower layer of metallic tantalum deposited by a PVD process and an upper layer disposed over the lower layer of tantalum nitride layer deposited by another PVD process. In another example, barrier layer 210 contains a lower layer of metallic tantalum deposited by an ALD process and an upper layer disposed over the lower layer of tantalum nitride layer deposited by a CVD process. In another example, barrier layer 210 contains a lower layer of metallic tantalum deposited by a PVD process and an upper layer disposed over the lower layer of tantalum nitride layer deposited by a CVD process.

For example, barrier layer 210 may contain tantalum nitride deposited using a CVD process or an ALD process wherein tantalum-containing compound or tantalum precursor (e.g., PDMAT) and nitrogen precursor (e.g., ammonia) are reacted. In one embodiment, tantalum and/or tantalum nitride is deposited as barrier layer 210 by an ALD process as described in commonly assigned U.S. Pat. No. 7,780,785, which is herein incorporated by reference. In one example, a Ta/TaN bilayer may be deposited as barrier layer 210, such as a metallic tantalum layer and a tantalum nitride layer that are independently deposited by ALD, CVD, and/or PVD processes, one layer on top of the other layer, in either order.

In another example, a Ti/TiN bilayer may be deposited as barrier layer 210, such as a metallic titanium layer and a titanium nitride layer that are independently deposited by ALD, CVD, and/or PVD processes, one layer on top of the other layer, in either order. In another example, a W/WN bilayer may be deposited as barrier layer 210, such as a metallic tungsten layer and a tungsten nitride layer that are independently deposited by ALD, CVD, and/or PVD processes, one layer on top of the other layer, in either order.

In some embodiments, barrier layer 210 may be optionally exposed to a pre-treatment process, such as a plasma process or a thermal process, during step 110 or immediately after step 110 prior to conducting step 120. Processing gases and/or reagents that may be exposed to substrate 200 during plasma or thermal pre-treatment processes include hydrogen (e.g., $H_2$ or atomic-H), nitrogen (e.g., $N_2$ or atomic-N), ammonia ($NH_3$), a hydrogen and ammonia mixture ($H_2$/$NH_3$), hydrazine ($N_2H_4$), diazene ($N_2H_2$), silane ($SiH_4$), disilane ($Si_2H_6$), helium, argon, derivatives thereof, plasmas thereof, or combinations thereof. The processing gas may flow into the processing chamber or be exposed to the substrate having a flow rate within a range from about 100 sccm to about 10 slm, such as from about 1 slm to about 6 slm, for example, about 3 slm.

In one embodiment, substrate 200 and barrier layer 210 may be exposed to a plasma to remove contaminants from barrier layer 210 during the pre-treatment process. In some examples, substrate 200 may be positioned within a processing chamber and exposed to a processing gas which is ignited to form the plasma. The processing gas may contain one gaseous compound or multiple gaseous compounds. Substrate 200 may be at ambient temperature or room temperature (about 18° C.-25° C., for example, about 23° C.), but is usually preheated to the desired temperature of the subsequent deposition process. Substrate 200 may be heated to a temperature within a range from about 100° C. to about 400° C., such as from about 125° C. to about 350° C., such as from about 150° C. to about 300° C., such as about 200° C. or about 250° C.

The processing chamber may produce an in situ plasma or be equipped with a remote plasma source (RPS). In one embodiment, substrate 200 may be exposed to the plasma (e.g., in situ or remotely) for a time period within a range from about 0.5 seconds to about 90 seconds, such as from about 10 seconds to about 60 seconds, such as from about 30 seconds to about 90 seconds. The plasma may be generated or otherwise formed at a power output setting within a range from about 60 watts to about 2,000 watts, such as from about 200 watts to about 600 watts or from about 600 watts to about 1,200 watts. The processing chamber may generally have an internal pressure of about 100 Torr or less, such as within a range from about 0.1 Torr to about 100 Torr, such as from about 0.5 Torr to about 50 Torr, such as from about 1 Torr to about 10 Torr.

In one example, substrate 200 and barrier layer 210 may be exposed to a plasma generated from hydrogen, ammonia, nitrogen, or mixtures thereof. In another example, substrate 200 and barrier layer 210 may be exposed to a plasma generated from hydrogen and ammonia. In another example, substrate 200 and barrier layer 210 may be exposed to a plasma generated from hydrogen, nitrogen, silane, disilane, or mixtures thereof. In another example, substrate 200 and barrier layer 210 may be exposed to a plasma generated from hydrogen, nitrogen, argon, helium, or mixtures thereof.

In another embodiment, substrate 200 and barrier layer 210 are exposed to a processing gas to remove contaminants from barrier layer 210 during a thermal pre-treatment process. The thermal pre-treatment process may be a rapid thermal process (RTP) or a rapid thermal annealing (RTA) process. Substrate 200 may be positioned within a processing chamber and exposed to at least one processing gas and/or reagent. The processing chamber may be a deposition chamber that may be used for a subsequent deposition process, such as a PVD chamber, a CVD chamber, or an ALD chamber. Alternatively, the processing chamber may be a thermal annealing chamber, such as the RADIANCE® RTA chamber, commercially available from Applied Materials, Inc., Santa Clara, Calif. Substrate 200 may be heated to a temperature within a range from about 25° C. to about 800° C., such as from about 50° C. to about 400° C., such as from about 100° C. to about 300° C. Substrate 200 may be heated for a time period within a range from about 2 minutes to about 20 minutes, such as from about 3 minutes to about 10 minutes. For example, substrate 200 may be heated to about 400° C. for about 5 minutes within the processing chamber.

In one example, substrate 200 and barrier layer 210 may be exposed to hydrogen, ammonia, nitrogen, or mixtures thereof while being heated within the processing chamber. In another example, substrate 200 and barrier layer 210 may be exposed to an ammonia/hydrogen mixture while being heated within the processing chamber. In another example, substrate 200 and barrier layer 210 may be exposed to hydrogen, nitrogen, silane, disilane, or mixtures thereof while being heated within the processing chamber. In another example, substrate 200 and barrier layer 210 may be exposed to hydrogen, nitrogen, argon, helium, or mixtures thereof while being heated within the processing chamber.

In another embodiment, cobalt stack 220 containing a cobalt material, such as metallic cobalt or metallic cobalt alloys may be deposited or otherwise formed on or over the substrate during step 120 of process 100. In one example, FIG. 2C depicts cobalt stack 220 disposed on or over barrier layer 210 and conformally within aperture 206. Cobalt stack 220 is generally a continuous film, but in some examples, may be a discontinuous film extending across barrier layer 210.

In one embodiment, step 120 provides that cobalt stack 220 may be deposited or otherwise formed during steps 122-126 of process 100. For example, cobalt stack 220 may be formed on or over barrier layer 210 by depositing a cobalt layer during a deposition process (step 122), exposing the cobalt layer to a plasma to form a plasma-treated cobalt layer during a plasma process (step 124), and repeating the cobalt deposition process and the plasma treatment process to form cobalt stack 220 containing a plurality of plasma-treated cobalt layers (step 126).

Cobalt stack 220 may be a single treated cobalt layer or non-treated cobalt layer, but in many embodiments, cobalt stack 220 contains multiple cobalt layers disposed on or over each other. Generally, cobalt stack 220 contains a plurality of treated cobalt layers, such as plasma-treated cobalt layers, disposed on or over each other, whereas, each cobalt layer is sequentially deposited and treated on or over each other to form cobalt stack 220. In some examples, cobalt stack 220 may contain a single plasma-treated cobalt layer. In other examples, the plurality of plasma-treated cobalt layers within cobalt stack 220 may contain at least 2 or more plasma-treated cobalt layers, such as at least 3 plasma-treated cobalt layers and may contain up to about 30 plasma-treated cobalt layers. In some examples, cobalt stack 220 contains more than 30 plasma-treated cobalt layers.

Each cobalt layer may be deposited during a deposition process, such as a CVD process or an ALD process during step 122. In some embodiments, each cobalt layer and/or plasma-treated cobalt layer contained within cobalt stack 220 may have a thickness of about 50 Å or less, such as within a range from about 2 Å to about 40 Å, such as from about 5 Å to about 30 Å, or from about 10 Å to about 25 Å. Therefore, cobalt stack 220 may have an overall thickness within a range from about 5 Å to about 1,000 Å or greater. In some examples, cobalt stack 220 may have a thickness within a range from about 10 Å to about 400 Å, such as from about 40 Å to about 200 Å, such as from about 80 Å to about 120 Å, for example, about 100 Å. In other examples, cobalt stack 220 may have a thickness within a range from about 400 Å to about 1,000 Å, such as from about 450 Å to about 750 Å, for example, about 600 Å.

Cobalt stack 220 may have a carbon concentration of about 5 at % (atomic weight percent) or less, such as about 3 at % or less, such as about 2 at % or less, such as about 1 at % or less, for example, about 0.5 at % or less. In some examples, cobalt stack 220 may have a carbon concentration within a range from about 0.1 at % to about 3 at %, such as from about 0.5 at % to about 3 at %, such as from about 0.5 at % to about 2 at %. In some embodiments, wherein the thickness of cobalt stack 220 is less than about 500 Å, such as less than about 200 Å, such as about 100 Å or less, the resistivity of cobalt stack 220 may be less than 60 μΩ-cm, such as about 50 μΩ-cm or less, such as within a range from about 5 μΩ-cm to about 50 μΩ-cm, such as from about 10 μΩ-cm to about 50 μΩ-cm, such as from about 20 μΩ-cm to about 40 μΩ-cm, for example, about 30 μΩ-cm.

In many examples, cobalt stack 220 may have a thickness within a range from about 80 Å to about 120 Å and a resistivity within a range from about 20 μΩ-cm to about 40 μΩ-cm. In some examples, cobalt stack 220 may have a thickness a thickness of about 100 Å and a resistivity of about 30 μΩ-cm. In other examples, cobalt stack 220 may have a thickness within a range from about 450 Å to about 750 Å and a resistivity within a range from about 5 μΩ-cm to about 20 μΩ-cm. In one example, cobalt stack 220 may have a thickness of about 600 Å and a resistivity of about 12 μΩ-cm.

Each of the cobalt layers forming cobalt stack 220 may independently be exposed to a plasma formed during the post-treatment process at step 124 of process 100. The plasma may be formed in situ or remotely during the post-treatment process. Contaminants from each of the deposited cobalt layers are removed or reduced while densifying cobalt stack 220 at step 124. Each of the cobalt layers forming cobalt stack 220 may be exposed to a reducing agent during the plasma process. Reducing agents that may be used during the post-treatment process include hydrogen (e.g., $H_2$ or atomic-H), ammonia ($NH_3$), a hydrogen and ammonia mixture ($H_2$/$NH_3$), nitrogen (e.g., $N_2$ or atomic-N), hydrazine ($N_2H_4$), diazene ($N_2H_2$), derivatives thereof, plasmas thereof, or combinations thereof. Each cobalt layer forming cobalt stack 220 may be exposed to the plasma during the post-treatment process for a time period within a range from about 2 seconds to about 300 seconds, such as from about 10 seconds to about 180 seconds, such as from about 10 seconds to about 90 seconds, such as from about 30 seconds to about 90 seconds, from about 45 seconds to about 75 seconds, for example, about 60 seconds.

The plasma treatment processes described herein provide cobalt stack 220 with reduced surface roughness relative to cobalt stack 220 containing non-treated cobalt layers. The plasma smoothes or reduces the surface roughness of the cobalt layers so that the plasma-treated cobalt layers have less surface roughness than non-treated, deposited cobalt layers. Cobalt stack 220 containing plasma-treated cobalt layers generally has a surface roughness of at least 20% less than the surface roughness of cobalt stack 220 containing non-treated cobalt layers which have not been exposed to the plasma treatment process. In one comparative example, cobalt stack 220 containing 5 plasma-treated cobalt layers has a thickness of about 100 Å and a surface roughness of about 1.1 nm, while cobalt stack 220 containing 5 non-treated cobalt layers has a thickness of about 100 Å and a surface roughness of about 1.5 nm. Thus, cobalt stack 220 containing plasma-treated cobalt layers has a surface roughness of about 27% less than the surface roughness of cobalt stack 220 containing non-treated cobalt layers.

In some examples, each cobalt layer forming cobalt stack 220 may be exposed to a hydrogen plasma, formed by igniting hydrogen gas in situ or remotely of the processing chamber. In other examples, each cobalt layer forming cobalt stack 220 may be exposed to an ammonia plasma, formed by igniting ammonia gas in situ or remotely of the processing chamber. In other examples, each cobalt layer forming cobalt stack 220 may be exposed to a hydrogen/ammonia plasma, formed by igniting a mixture of hydrogen gas and ammonia gas in situ or remotely of the processing chamber.

The cobalt layers contained within cobalt stack 220 may be deposited by thermal decomposition of a cobalt source gas carried by an inert gas during step 120. A reducing gas may be co-flowed or alternately pulsed into the processing chamber along with the cobalt source gas. The substrate may be heated to a temperature within a range from about 50° C. to about 600° C., such as from about 100° C. to about 500° C., such as from about 200° C. to about 400° C. Alternatively, the cobalt layers contained within cobalt stack 220 may be deposited by exposing the substrate to a cobalt source gas gas in an ALD or CVD process.

Each of the cobalt layers contained within cobalt stack 220 may be formed or deposited by a vapor deposition process, such as CVD, PE-CVD, pulsed-CVD, ALD, PE-ALD, or PVD during step 122. The plasma enhanced vapor deposition process, namely PE-CVD and PE-ALD, may be an in situ plasma process within the processing chamber or may be a remote plasma process such that the plasma may be ignited, generated, or otherwise formed within an RPS and directed into the processing chamber. In one embodiment, steps 122 and 124 may be performed during a plasma enhanced vapor deposition process, such as PE-CVD and PE-ALD. In many examples, cobalt stack 220 and the cobalt layers contain metallic cobalt. Alternatively, in other examples, cobalt stack 220 and the cobalt layers may contain one or more cobalt materials, such as metallic cobalt, cobalt silicide, cobalt boride, cobalt phosphide, alloys thereof, derivatives thereof, or combinations thereof.

In some embodiments, cobalt stack 220 and cobalt layers contained therein may be formed or deposited by simultaneously introducing a cobalt precursor and at least one reagent, such as hydrogen gas ($H_2$), into the processing chamber during a thermal CVD process, a pulsed-CVD process, a PE-CVD process, or a pulsed PE-CVD process. In other embodiments, the cobalt precursor may be introduced into the processing chamber without a reagent during a thermal CVD process, a pulsed-CVD process, a PE-CVD process, or a pulsed PE-CVD process. Alternatively, in other embodiments, cobalt stack 220 may be formed or deposited by sequentially introducing a cobalt precursor and at least one reagent into the processing chamber during a thermal ALD process or a PE-ALD process.

The cobalt materials (e.g., metallic cobalt or cobalt alloys) contained within cobalt stack 220 and the cobalt layers, as described herein, may be formed by CVD or ALD processes utilizing suitable cobalt precursors which include cobalt carbonyl complexes, cobalt amidinates compounds, cobaltocene compounds, cobalt dienyl complexes, cobalt nitrosyl complexes, derivatives thereof, complexes thereof, plasmas thereof, or combinations thereof. In some embodiments, cobalt materials may be deposited by CVD and ALD processes further described in commonly assigned U.S. Pat. Nos. 7,264,846 and 7,404,985, which are herein incorporated by reference.

In some embodiments, cobalt carbonyl compounds or complexes may be utilized as cobalt precursors for forming the cobalt materials during the vapor deposition process. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, butylacetylene, nitrosyl, ammonia, derivatives thereof, complexes thereof, plasmas thereof, or combinations thereof.

In one embodiment, dicobalt hexacarbonyl acetyl compounds may be used to form cobalt materials (e.g., cobalt stack 220) during the vapor deposition process. Dicobalt hexacarbonyl acetyl compounds may have the chemical formula of $(CO)_6Co_2(RC\equiv CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6Co_2(HC\equiv C^tBu)$) is the cobalt precursor. Other examples of dicobalt hexacarbonyl acetyl compounds include dicobalt hexacarbonyl methylbutylacetylene $((CO)_6Co_2(MeC\equiv C^tBu))$, dicobalt hexacarbonyl phenylacetylene $((CO)_6Co_2(HC\equiv CPh))$, hexacarbonyl methyl phenylacetylene $((CO)_6Co_2(MeC\equiv CPh))$, dicobalt hexacarbonyl methylacetylene $((CO)_6Co_2(HC\equiv CMe))$, dicobalt hexacarbonyl dimethylacetylene $((CO)_6Co_2(MeC\equiv CMe))$, derivatives thereof, complexes thereof, plasmas thereof, or combinations thereof. Other exemplary cobalt carbonyl complexes include cyclopentadienyl cobalt bis(carbonyl) ($CpCo(CO)_2$), tricarbonyl allyl cobalt ($(CO)_3Co(CH_2CH\equiv CH_2)$), derivatives thereof, complexes thereof, plasmas thereof, or combinations thereof.

In another embodiment, cobalt amidinates or cobalt amido complexes may be utilized as cobalt precursors for forming the cobalt materials during the vapor deposition process. Cobalt amido complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di(butyldimethylsilyl)amido) cobalt $(((BuMe_2Si)_2N)_2Co)$, bis(di(ethyldimethylsilyl)amido) cobalt $(((EtMe_2Si)_2N)_2Co)$, bis(di(propyldimethylsilyl)amido) cobalt $(((PrMe_2Si)_2N)_2Co)$, bis(di(trimethylsilyl)amido) cobalt $(((Me_3Si)_2N)_2Co)$, tris(di(trimethylsilyl)amido) cobalt $(((Me_3Si)_2N)_3Co)$, derivatives thereof, complexes thereof, plasmas thereof, or combinations thereof.

Exemplary cobalt precursors include methylcyclopentadienyl cobalt bis(carbonyl) ($MeCpCo(CO)_2$), ethylcyclopentadienyl cobalt bis(carbonyl) ($EtCpCo(CO)_2$), pentamethylcyclopentadienyl cobalt bis(carbonyl) ($Me_5CpCo(CO)_2$), dicobalt octa(carbonyl) ($Co_2(CO)_8$), nitrosyl cobalt tris(carbonyl) ($(ON)Co(CO)_3$), bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasmas thereof, or combinations thereof.

In some examples, alternative reagents, including reducing agents, may be used with cobalt precursors for forming the cobalt materials during the vapor deposition process as described herein. These alternative reagents may include hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

In one example, cobalt stack 220 containing metallic cobalt is deposited or otherwise formed by simultaneously exposing substrate 200 to a cobalt source gas and a reducing agent during a thermal CVD process. In another example, cobalt stack 220 containing metallic cobalt is deposited by simultaneously exposing substrate 200 to a cobalt source gas and a reducing agent gas during a plasma enhanced CVD process. The plasma source may be an in situ plasma source within the CVD chamber or an RPS positioned outside of the CVD chamber. The cobalt source gas may be formed by passing a carrier gas (e.g., nitrogen or argon) through an ampoule of a cobalt precursor (e.g., CCTBA). The reducing agent gas may be a single compound (e.g., $H_2$), and therefore have no carrier gas. Alternatively, the reducing agent gas may be formed by passing a carrier gas through an ampoule of a reducing agent.

The ampoule may be heated depending on the cobalt precursor or reducing agent used during the process. In one example, an ampoule containing a cobalt precursor, such as a dicobalt hexacarbonyl acetyl compound or other cobalt carbonyl compound (e.g., $(CO)_xCo_yL_z$) may be heated to a temperature within a range from about 30° C. to about 500° C. The cobalt source gas may generally have a flow rate within a range from about 100 sccm (standard cubic centimeters per minute) to about 2,000 sccm, such as from about 200 sccm to about 1,000 sccm, such as from about 300 sccm to about 700 sccm, for example, about 500 sccm. The reducing agent gas may generally have a flow rate within a range from about 0.5 slm (standard liters per minute) to about 10 slm, such as from about 1 slm to about 8 slm, such as from about 2 slm to about 6 slm. In one example, reducing agent gas is hydrogen and has a flow rate within a range from about 2 slm to about 6 slm, such as about 4 slm.

The cobalt source gas and the reducing agent gas (e.g., $H_2$) may be combined to form a deposition gas prior to, while, or subsequent to entering the processing chamber during a deposition process to deposit cobalt stack 220 over or on containing barrier layer 210. Substrate 200 containing barrier layer 210 may be positioned within a processing chamber and heated to a temperature within a range from about 25° C. to about 800° C., such as from about 50° C. to about 400° C., such as from about 100° C. to about 250° C., such as about 150° C. Once at a predetermined temperature, substrate 200 may be exposed to the deposition gas containing the cobalt source gas and the reducing agent gas for a time period within a range from about 0.1 seconds to about 120 seconds, such as from about 1 second to about 60 seconds, such as from about 5 seconds to about 30 seconds. In some examples, substrate 200 containing barrier layer 210 may be heated to about 150° C. for about 10 minutes within the processing chamber while being exposed to a deposition gas and forming cobalt stack 220 during a thermal CVD process. In one example, the deposition gas contains dicobalt hexacarbonyl butylacetylene (CCTBA) as a cobalt source gas and hydrogen gas ($H_2$) as the reducing agent gas.

In another embodiment, the steps 122 and 124 for depositing and treating each cobalt layer are repeated at least once, but usually multiple times, until achieving a desirable or predetermined thickness of cobalt stack 220 at step 126. The cobalt deposition process and the plasma treatment process may be performed once to form a single layer of cobalt stack 220, or performed multiple times to form multiple treated cobalt layers, such as from 2 cobalt layers to about 10 cobalt layers, to about 24 cobalt layers, or more layers to form cobalt stack 220. Each cobalt layer may be deposited having a thickness within a range from about 2 Å to about 50 Å, such as from about 3 Å to about 25 Å, such as from about 4 Å to about 20 Å, such as from about 5 Å to about 10 Å, such as about 7 Å or about 8 Å. In one example, four cycles of the deposition and plasma treatment processes to form treated cobalt layers are sequentially performed to form cobalt stack 220 with a thickness of about 100 Å and containing four treated cobalt layers. In another example, twenty four cycles of the deposition and plasma treatment processes to form treated cobalt layers are sequentially performed to form cobalt stack 220 with a thickness of about 600 Å and containing twenty four treated cobalt layers. At step 126, once the desirable or predetermined thickness of cobalt stack 220 is achieved, step 120 may be ceased and substrate 200 may progress to step 130 or to another fabrication or treatment process.

In other embodiments, cobalt oxide layer 230 may be formed by oxidizing at least a portion of cobalt stack 220 during a surface oxidation process at step 130 of process 100. In one embodiment, as depicted in FIG. 2D, cobalt oxide layer 230 is formed from an upper portion of cobalt stack 220 (e.g., upper surfaces of cobalt stack 220) and conformally formed within aperture 206 disposed on substrate 200. Cobalt oxide layer 230 is usually maintained disposed on cobalt stack 220 during the thermal annealing crystallization process at step 140 in order to prevent or substantially prevent agglomeration of the cobalt material within cobalt stack 220. In an alternative embodiment, cobalt stack 220 may be completely oxidized or substantially oxidized and therefore consumed to form cobalt oxide layer 230.

Cobalt oxide layer 230 may be a continuous film extending across the field of substrate 200, but in some examples, cobalt oxide layer 230 may be a discontinuous film extending across the field of substrate 200. The thickness of cobalt oxide layer 230 depends on the particular oxidization process and parameters of such process utilized to form the cobalt oxide material. Therefore, the thickness of cobalt oxide layer 230 may be within a range from about 2 Å to about 50 Å, such as from about 4 Å to about 40 Å, such as such as from about 5 Å to about 30 Å. In some examples, the thickness of cobalt oxide layer 230 may be within a range from about 5 Å to about 15 Å, such as from about 8 Å to about 12 Å, for example, about 10 Å, while in other examples, the thickness may be within a range from about 15 Å to about 20 Å, such as about 17 Å or about 18 Å.

In one embodiment, cobalt oxide layer 230 may be formed by exposing cobalt stack 220 to air, such as ambient air, during the surface oxidization process at step 130. Cobalt stack 220 may be exposed to the air at ambient temperature or room temperature (about 18° C.-25° C., for example, about 20° C.) to form cobalt oxide layer 230 from an upper portion of cobalt stack 220, such as an upper surface of cobalt stack 220. The air generally contains oxygen ($O_2$) at a volumetric concentration within a range from about 18% to about 24%, such as from about 20% to about 22%, for example, about 20.95% or about 21%. During the air-exposed surface oxidization process of this embodiment, the air and or substrate 200 may be at room or ambient temperature, such as the temperature of a manufacturing or fabrication environment, which may be within a range from about 15° C. to about 26° C., such as from about 18° C. to about 22° C., such as about 20° C. Substrate 200 containing cobalt stack 220 may be exposed to the air or oxygen enriched air during the air-exposed surface oxidization process for a time period within a range from about 5 minutes to about 24 hours, such as from about 1 hour to about 10 hours. The thickness of cobalt oxide layer 230 formed by the air-exposed surface oxidization process may be within a range from about 5 Å to about 30 Å, such as from about 10 Å to about 25 Å, such as from about 15 Å to about 20 Å, for example, about 17 Å.

In another embodiment, cobalt oxide layer 230 may be formed by exposing cobalt stack 220 to an oxygen source gas during the surface oxidization process, such as an oxygen-flash oxidization process at step 130. An upper portion of cobalt stack 220, such as an upper surface of cobalt stack 220, may be exposed to the oxygen source gas at a process temperature and for a predetermined time to form cobalt oxide layer 230. An exemplary oxygen source gas may contain oxygen ($O_2$), air, oxygen-enriched air, atomic-O, ozone ($O_3$), nitrous oxide ($N_2O$), nitric oxide (NO), nitrogen dioxide ($NO_2$), dinitrogen tetroxide ($N_2O_4$), water vapor ($H_2O$), at least one carrier gas (e.g., $N_2$, Ar, or He), mixtures thereof, or combinations thereof. In one example, the oxygen source gas contains oxygen gas without a carrier gas or other diluting gas. In another example, the oxygen source gas contains oxygen gas within a carrier gas of nitrogen or argon, and the oxygen gas has a volumetric concentration of the oxygen source gas within a range from about 5% to about 95%, such as from about 50% to about 90%, for example, about 80%.

During the oxygen-flash oxidization process, the oxygen source gas, substrate 200, and/or cobalt stack 220 may be at a process temperature within a range from about 20° C. to about 500° C., such as about 200° C. to about 500° C., such as from about 250° C. to about 350° C., such as about 300° C. In some examples, cobalt stack 220 disposed on substrate 200 may be exposed to the oxygen source gas during the oxygen-flash oxidization process at step 130 for a time period within a range from about 1 second to about 120 seconds, such as about 60 seconds or less, such as from about 1 second to about 60 seconds, such as from about 5 seconds to about 60 seconds, or from about 5 seconds to about 20 seconds, such as about 10 seconds. In other examples, cobalt stack 220 disposed on substrate 200 may be exposed to the oxygen source gas during the oxygen-flash oxidization process at step 130 for a time period within a range from about 1 minute to about 20 minutes, such as from about 2 minutes to about 15 minutes, such as from about 3 minutes to about 10 minutes, or from about 4 minutes to about 8 minutes, for example, about 5 minutes. The pressure within the processing chamber while conducting the oxygen-flash oxidization process during step 130 may be less than 760 Torr, such as within a range from about 0.01 Torr to about 750 Torr, from about 0.1 Torr to about 100 Torr, for example, about 10 Torr. The thickness of cobalt oxide layer 230 formed by the oxygen-flash oxidization process may be within a range from about 3 Å to about 30 Å, such as from about 4 Å to about 20 Å, such as from about 5 Å to about 15 Å, such as from about 7 Å to about 13 Å, for example, about 10 Å.

In another embodiment, during step 140 of process 100, the remaining portion of cobalt stack 220, optionally containing cobalt oxide layer 230 disposed thereon, may be heated to a crystallization temperature by a thermal annealing crystallization process to form crystalline cobalt film 240, as depicted in FIG. 2E. Cobalt stack 220 may be amorphous or crystalline prior to step 140. However, the thermal annealing crystallization process during step 140 either crystallizes or improves the crystallinity of the cobalt material contained within cobalt stack 220 to form crystalline cobalt film 240. Cobalt oxide layer 230 disposed on cobalt stack 220 prevents or substantially prevents the agglomeration of the cobalt material within cobalt stack 220 during the thermal annealing crystallization process to form crystalline cobalt film 240.

In some examples, the processing chamber and/or cobalt stack 220 disposed on or over substrate 200 may be heated to and/or maintained at the crystallization temperature. The crystallization temperature may be maintained within a range from about 200° C. to about 800° C., such as from about 250° C. to about 600° C. to form crystalline cobalt film 240 from the remaining portion of cobalt stack 220 by the thermal annealing crystallization process during step 140. In many examples, the crystallization temperature may be about 500° C. or less, such as about 450° C. or less, such as within a range from about 300° C. to about 500° C., such as from about 375° C. to about 425° C., such as from about 390° C. to about 420° C., for example, about 410° C. during the thermal annealing crystallization process.

The processing chamber and/or cobalt stack 220 disposed on or over substrate 200 may be heated and maintained at or near the crystallization temperature during the thermal annealing crystallization process for a time period within a range from about 5 minutes to about 90 minutes, such as from about 5 minutes to about 60 minutes, such as from about 15 minutes to about 60 minutes, such as from about 20 minutes to about 40 minutes, for example, about 30 minutes. In some examples, the thermal annealing crystallization process may lasts for a time period within a range from about 5 minutes to about 60 minutes at crystallization temperature within a range from about 300° C. to about 425° C. at step 140. In other examples, processing chamber and/or cobalt stack 220 disposed on or over substrate 200 may be heated for a time period within a range from about 20 minutes to about 40 minutes at crystallization temperature within a range from about 390° C. to about 420° C.

In some examples, crystalline cobalt film 240 may be formed under a reduced pressure environment, such as under a vacuum, during the thermal annealing crystallization process. In other examples, crystalline cobalt film 240 may be formed while exposed to a processing gas, such as an annealing gas, during the thermal annealing crystallization process. Processing gases or annealing gases and/or reagents may be exposed to substrate 200 containing cobalt stack 220 capped with cobalt oxide layer 230 during the thermal annealing crystallization process. The processing gases, annealing gases, and/or other reagents may contain or include hydrogen gas ($H_2$), nitrogen gas ($N_2$), ammonia ($NH_3$), hydrazine ($N_2H_4$), diazene ($N_2H_2$), a hydrogen and ammonia mixture ($H_2/NH_3$), a hydrogen and argon mixture ($H_2/Ar$), helium, argon, neon, derivatives thereof, or combinations thereof. The processing gas, such as an annealing gas, may flow into the processing chamber or be exposed to substrate 200 during the thermal annealing crystallization process may have a flow rate within a range from about 100 sccm to about 10 slm, such as from about 1 slm to about 6 slm, for example, about 3 slm.

In several examples, the remaining portion of cobalt stack 220 disposed on or over substrate 200, optionally containing cobalt oxide layer 230 disposed thereon, may be exposed to a RTP process or a RTA process as the thermal annealing crystallization process during step 140. Substrate 200 containing cobalt stack 220 may be positioned within a processing chamber and exposed to at least one processing gas and/or reagent. The processing chamber may be a deposition chamber that was used in a prior deposition process or may be used for a subsequent deposition process, such as a PVD chamber, a CVD chamber, or an ALD chamber. Alternatively, the processing chamber may be a thermal annealing chamber, such as the RADIANCE® RTA chamber, commercially available from Applied Materials, Inc., Santa Clara, Calif. Substrate 200 and cobalt oxide layer 230 may be heated to a temperature within a range from about 200° C. to about 800° C., such as from about 300° C. to about 600° C., such as from about 350° C. to about 500° C., for example, about 400° C. Substrate 200 and cobalt oxide layer 230 may be heated for a time period within a range from about 5 minutes to about 120 minutes, such as from about 10 minutes to about 60 minutes, such as from about 15 minutes to about 45 minutes, for example, about 30 minutes. Substrate 200 and cobalt oxide layer 230 may be under a vacuum or reduced pressure environment within the processing/annealing chamber at a pressure of less than 760 Torr, such as within a range from about 0.01 Torr to about 750 Torr, from about 0.1 Torr to about 100 Torr, for example, about 10 Torr.

In some examples of the thermal annealing crystallization process, substrate 200 containing cobalt stack 220 capped with cobalt oxide layer 230 may be heated to about 410° C., while under a vacuum pressure of about 100 Torr for about 30 minutes within the processing chamber at step 140. In other examples, substrate 200 containing cobalt stack 220 capped with cobalt oxide layer 230 may be heated to about 400° C. while being exposed to hydrogen gas for about 30 minutes within the processing chamber to form crystalline cobalt film 240 from cobalt stack 220. In other examples, substrate 200 containing cobalt stack 220 capped with cobalt oxide layer 230 may be heated to about 450° C. while being exposed to argon or nitrogen gas for about 40 minutes within the processing chamber to form crystalline cobalt film 240.

Crystalline cobalt film 240 may have a thickness within a range from about 5 Å to about 1,000 Å or greater. In some examples, crystalline cobalt film 240 may have a thickness within a range from about 10 Å to about 400 Å, such as from about 40 Å to about 200 Å, such as from about 80 Å to about 120 Å, for example, about 100 Å. In other examples, crystalline cobalt film 240 may have a thickness within a range from about 400 Å to about 1,000 Å, such as from about 450 Å to about 750 Å, for example, about 600 Å.

Crystalline cobalt film 240 may have a carbon concentration of about 5 at % or less, such as about 3 at % or less, such as about 2 at % or less, such as about 1 at % or less, for example, about 0.5 at % or less. In some examples, crystalline cobalt film 240 may have a carbon concentration within a range from about 0.1 at % to about 3 at %, such as from about 0.5 at % to about 3 at %, such as from about 0.5 at % to about 2 at %. The resistivity of crystalline cobalt film 240 is less than 60 μΩ-cm, such as about 50 μΩ-cm or less, such as within a range from about 5 μΩ-cm to about 50 μΩ-cm, such as from about 10 μΩ-cm to about 50 μΩ-cm, such as from about 20 μΩ-cm to about 40 μΩ-cm, for example, about 30 μΩ-cm. Crystalline cobalt film 240 may have a thickness within a range from about 80 Å to about 120 Å and a resistivity within a range from about 20 μΩ-cm to about 40 μΩ-cm. In some examples, crystalline cobalt film 240 may have a thickness a thickness of about 100 Å and a resistivity of about 30 μΩ-cm. In other examples, crystalline cobalt film 240 may have a thickness within a range from about 450 Å to about 750 Å and a resistivity within a range from about 5 μΩ-cm to about 20 μΩ-cm. In one example, crystalline cobalt film 240 may have a thickness of about 600 Å and a resistivity of about 12 μΩ-cm.

The cobalt oxide material contained within cobalt oxide layer 230 is an electrically conducting material, but usually has greater resistivity (e.g., about 1-10 Ω-cm) compared to the resistivity of metallic cobalt material or cobalt stack 220 (e.g., about 20-40 μΩ-cm). In some embodiments, the resistivity of the cobalt oxide materials within cobalt oxide layer 230 is acceptable for certain applications including some high gate stack applications. Therefore, in some embodiments, contact film 280 may be directly deposited, plated, or otherwise formed on the silicon oxide layer. However, in other applications, these cobalt oxide materials may cause unacceptably high resistance. Therefore, in other embodiments described herein, cobalt oxide layer 230 may be exposed to at least one treatment process or other process to remove, disrupt or interrupt, breech, and/or otherwise break or separate, or to implant or dope the cobalt oxide material contained within cobalt oxide layer 230 prior to depositing, plating, or otherwise forming contact film 280 on or over cobalt oxide layer 230.

In one embodiment, subsequent to step 140, step 150 may be conducted during process 100. Step 150 includes exposing cobalt oxide layer 230 to a reducing agent or a reducing plasma (e.g., a hydrogen plasma) to form metallic cobalt layer 250 from cobalt oxide layer 230. Thereafter, process 100 further includes forming contact film 280 on or over metallic cobalt layer 250 during step 180, as depicted in FIGS. 2E and 2G-2H. The reducing agent and/or reducing plasma may be exposed to the cobalt oxide materials contained within cobalt oxide layer 230. The cobalt oxide material is chemically reduced to form metallic cobalt materials (e.g., metallic cobalt or cobalt alloys) such as contained within metallic cobalt layer 250. The cobalt oxide materials contained within cobalt oxide layer 230 may be exposed to reducing agents in the form or state of plasma, gas, fluid, liquid, or combinations thereof. Generally, the thickness of metallic cobalt layer 250 may be within a range from about 2 Å to about 20 Å, such as from about 3 Å to about 10 Å, for example, about 5 Å.

In many examples, the processing gas containing the reducing agent is within a plasma to provide a reducing plasma. Reducing agents and/or reducing plasmas may also contain a carrier gas or a processing gas. Exemplary compounds that may be contained or used as reducing agents and/or reducing plasmas during step 150 include hydrogen (e.g., $H_2$ or atomic-H), ammonia ($NH_3$), hydrazine ($N_2H_4$), diazene ($N_2H_2$), a hydrogen and ammonia mixture ($H_2/NH_3$), a hydrogen and argon mixture ($H_2/Ar$), a hydrogen and nitrogen mixture ($H_2/N_2$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), nitrogen (e.g., $N_2$ or atomic-N), helium, argon, neon, derivatives thereof, plasmas thereof, or combinations thereof. The processing gas may flow into the processing chamber or be exposed to substrate 200 having a flow rate within a range from about 100 sccm to about 10 slm, such as from about 1 slm to about 6 slm, for example, about 3 slm.

In one embodiment, cobalt oxide layer 230 disposed on crystalline cobalt film 250 contained on substrate 200 may be exposed to a reducing plasma formed from a processing gas containing hydrogen gas as the reducing agent. Substrate 200 may be positioned within a processing chamber and cobalt oxide layer 230 may be exposed to the reducing plasma which is ignited, generated, or otherwise formed from the processing gas. The processing gas may contain one gaseous compound or multiple gaseous compounds. Substrate 200 may be at ambient temperature or room temperature (about 18° C.-25° C., for example, about 23° C.), but is usually preheated to the desired temperature of the subsequent processing step. Substrate 200 may be heated to a temperature within a range from about 100° C. to about 400° C., such as from about 125° C. to about 350° C., such as from about 150° C. to about 300° C., such as about 200° C. or about 250° C.

A plasma may be generated external from the processing chamber, such as by a remote plasma source (RPS) system, or alternatively, the plasma may be generated in situ a plasma capable deposition chamber, such as a PE-CVD chamber during a plasma treatment process. The plasma may be generated from a microwave (MW) frequency plasma generator or a radio frequency (RF) plasma generator. In one example, an in situ plasma is generated by an RF plasma generator. The processing chamber may be pressurized during the plasma treatment process at a pressure within a range from about 0.1 Torr to about 100 Torr, such as from about 0.5 Torr to about 50 Torr, such as from about 1 Torr to about 10 Torr. Also, the plasma chamber or substrate 200 may be heated to a temperature of less than about 500° C., preferably within a range from about 100° C. to about 450° C., such as from about 150° C. to about 400° C., for example, about 300° C. In one embodiment, substrate 200 may be exposed to the plasma (e.g., in situ or remotely) for a time period within a range from about 20 seconds to about 10 minutes, such as from about 30 seconds to about 5 minutes, such as from about 1 minute to about 3 minutes, for example, about 2 minutes.

The RF plasma generator may be set at a frequency within a range from about 100 kHz to about 100 MHz. In one example, an RF plasma generator, with a frequency of 13.56 MHz, may be set to have a power output setting within a range from about 200 watts to about 1,200 watts, such as from about 250 watts to about 600 watts, such as from about 300 watts to about 500 watts. In another example, a VHF RF plasma generator, with a frequency of 40 MHz, may be set to have a power output setting within a range from about 200 watts to about 2,000 watts, such as from about 500 watts to about 1,500 watts, such as from about 800 watts to about 1,200 watts, for example, about 1,000 watts. In another example, an RF plasma generator, with a frequency of 80 MHz, may be set to have a power output setting within a range from about 200 watts to about 2,000 watts, such as from about 500 watts to about 1,500 watts, such as from about 800 watts to about 1,200 watts, for example, about 1,000 watts. In another example, an RF plasma generator, with a frequency of 350 kHz, may be set to have a power output setting within a range from about 200 watts to about 2,000 watts, such as from about 500 watts to about 1,500 watts, such as from about 800 watts to about 1,200 watts, for example, about 1,000 watts. A surface of substrate may be exposed to a plasma having a power per surface area value within a range from about 0.01 watts/cm$^2$ to about 10.0 watts/cm$^2$, such as from about 0.05 watts/cm$^2$ to about 6.0 watts/cm$^2$.

In many embodiments described herein, the plasma generated during the plasma treatment process, as well as during other plasma processes, is generated by a VHF RF plasma generator at a frequency of 40 MHz. Such VHF plasma has been utilized to achieve many improvements over other plasma treatment processes conducted with RF plasma at frequencies outside of the VHF range, such as at a frequency of 13.56 MHz. The plasma-treated cobalt layers, cobalt stacks 220, crystalline cobalt films 240, metallic cobalt layers 250, and other materials formed by processes utilizing the VHF plasma as described herein have a reduction in resistivity, surface roughness, carbon content, and plasma damage relative to similar materials formed by processes relying on RF plasma at a frequency outside of the VHF range.

In some examples, cobalt oxide layer 230 contained on crystalline cobalt film 250 disposed on or over substrate 200 may be exposed to a hydrogen plasma generated from hydrogen gas ignited or otherwise formed by an RPS during step 150 of process 100. Cobalt oxide layer 230 may be exposed to hydrogen gas with a flow rate within a range from about 2 slm to about 4 slm. The processing chamber may have an internal pressure within a range from about 1 Torr to about 10 Torr, and the plasma may be ignited, generated, or otherwise formed by an RPS with an RF plasma generator having a frequency of 40 MHz and a power output setting within a range from about 60 watts to about 2,000 watts, such as from about 300 watts to about 500 watts or from about 300 watts to about 2,000 watts. In one embodiment, cobalt oxide layer 230 may be exposed to the hydrogen plasma for a time period within a range from about 20 seconds to about 5 minutes, such as from about 1 minute to about 3 minutes. Multiple treatments or exposures to the hydrogen plasma may be performed during step 150.

In other examples, cobalt oxide layer 230 contained on crystalline cobalt film 250 disposed on or over substrate 200 may be exposed to a reducing plasma generated within a processing chamber (e.g., an in situ plasma) from hydrogen gas to form metallic cobalt layer 250 during step 150 of process 100. The reducing plasma generated from hydrogen gas may be formed by an RF plasma generator, with a frequency of 40 MHz, and may have a power output setting within a range from about 200 watts to about 1,600 watts.

In other examples, cobalt oxide layer 230 contained on crystalline cobalt film 250 disposed on or over substrate 200 may be exposed to a reducing plasma generated from a mixture of hydrogen gas and argon to form metallic cobalt layer 250. The reducing plasma generated from the mixture of hydrogen gas and argon may be formed by an RF plasma generator, with a frequency of 40 MHz, and may have a power output setting within a range from about 200 watts to about 2,000 watts.

In other examples, cobalt oxide layer 230 contained on crystalline cobalt film 250 disposed on or over substrate 200 may be exposed to a reducing plasma generated from a mixture of hydrogen gas and nitrogen gas to form metallic cobalt layer 250. The reducing plasma generated from the mixture of hydrogen gas and nitrogen gas may be formed by an RF plasma generator, with a frequency of 40 MHz, and may have a power output setting within a range from about 200 watts to about 2,000 watts.

In other examples, cobalt oxide layer 230 contained on crystalline cobalt film 250 disposed on or over substrate 200 may be exposed to a reducing plasma generated from a mixture of hydrogen gas and ammonia to form metallic cobalt layer 250. The reducing plasma generated from the mixture of hydrogen gas and ammonia may be formed by an RF plasma generator, with a frequency of 40 MHz, and may have a power output setting within a range from about 200 watts to about 2,000 watts.

In other examples, cobalt oxide layer 230 contained on crystalline cobalt film 250 disposed on or over substrate 200 may be exposed to a reducing plasma generated from a mixture of hydrogen, ammonia, and nitrogen to form metallic cobalt layer 250. The reducing plasma generated from the mixture of hydrogen, ammonia, and nitrogen may be formed by an RF plasma generator, with a frequency of 40 MHz, and may have a power output setting within a range from about 200 watts to about 2,000 watts.

In another embodiment, subsequent to step 140, conductive metallic layer 260 may be deposited, plated, or otherwise formed on or over cobalt oxide layer 230 disposed on crystalline cobalt film 240 in step 160 of process 100. Subsequently, substrate 200 containing conductive metallic layer 260 may be exposed to a thermal annealing process during step 170 of process 100. During the thermal annealing process, the metal (e.g., Al) contained within conductive metallic layer 260 is diffused or otherwise is dispersed into the cobalt oxide material of cobalt oxide layer 230 and into the cobalt material of crystalline cobalt film 240. The resistivity of cobalt oxide layer 230 and the resistivity of crystalline cobalt film 240 are reduced due to the dispersed metal derived from conductive metallic layer 260. Thereafter, process 100 includes conducting step 180 by depositing, plating, or otherwise forming contact film 280 on or over any remaining conductive metallic layer 260, cobalt oxide layer 230, doped variants of cobalt oxide layer 230, crystalline cobalt film 240, and/or doped variants of crystalline cobalt film 240, as depicted in FIGS. 2E and 2I-2J.

Conductive metallic layer 260 containing the metal may be deposited, plated, or otherwise formed on or over cobalt oxide layer 230 disposed on crystalline cobalt film 240. The metal contained within conductive metallic layer 260 may be aluminum, copper, aluminum-copper alloy, titanium, silver, gold, nickel, tungsten, molybdenum, alloys thereof, or combinations thereof. In many examples, conductive metallic layer 260 contains aluminum or an aluminum alloy. The thickness of conductive metallic layer 260 is generally about 50 Å or less, such as within a range from about 2 Å to about 40 Å, such as from about 3 Å to about 20 Å, such as from about 4 Å to about 15 Å, or from about 5 Å to about 10 Å. Conductive metallic layer 260 may be deposited, plated, or formed by an ALD process, a PE-ALD process, a CVD process, a PE-CVD process, a PVD process, an electroless deposition process, an ECP process, or similar techniques.

In another embodiment, conductive metallic layer 260 may be heated to a predetermined temperature by a thermal annealing process while the metal initially contained within conductive metallic layer 260 diffuses into cobalt oxide layer 230 and crystalline cobalt film 240 during step 170 of process 100. The predetermined temperature of conductive metallic layer 260 may be within a range from about 200° C. to about 800° C., such as from about 250° C. to about 600° C., such as from about 300° C. to about 500° C. while diffusing the metal from conductive metallic layer 260 and into crystalline cobalt film 240 by the thermal annealing process during step 170. During the thermal annealing process, the processing chamber and/or substrate 200 may be heated to a temperature of less than about 500° C., preferably within a range from about 100° C. to about 450° C., such as from about 150° C. to about 400° C., for example, about 300° C. In one embodiment, conductive metallic layer 260, cobalt oxide layer 230, and crystalline cobalt film 240 disposed on or over substrate 200 may be exposed to the thermal annealing process during step 170. Generally, the thermal annealing process at step 170 may last a time period within a range from about 20 seconds to about 10 minutes, such as from about 30 seconds to about 5 minutes, such as from about 1 minute to about 3 minutes, for example, about 2 minutes.

Contact film 280 may contain one layer or multiple layers of at least one conductive material and may be deposited or formed during a single deposition process or multiple deposition processes during step 180, as depicted in FIGS. 2F, 2H, and 2J. Contact film 280 may be deposited, plated, or otherwise formed on or over substrate 200 during one or several deposition processes during step 180. Contact film 280 may be deposited, plated, or otherwise formed on or over cobalt oxide layer 230, doped variants of cobalt oxide layer 230, crystalline cobalt film 240, doped variants of crystalline cobalt film 240, metallic cobalt layer 250, conductive metallic layer 260, barrier layers, seed layers, nucleation layers, other layers, or combinations thereof. The conductive material of contact film 280 may contain a contact metal, such as copper, tungsten, aluminum, copper-aluminum alloy, ruthenium, cobalt, silver, gold, platinum, palladium, alloys thereof, derivatives thereof, or combinations thereof.

In one embodiment, contact film 280 may contain at least one seed layer or nucleation layer as well as at least one fill layer or bulk layer. A seed layer formed as a portion of contact film 280 may be deposited, plated, or otherwise formed on or over cobalt oxide layer 230, crystalline cobalt film 240, metallic cobalt layer 250, or conductive metallic layer 260 during one or several deposition processes during step 180. The seed layer, as a portion of contact film 280, may contain a conductive metal, such as copper, tungsten, aluminum, ruthenium, cobalt, titanium, silver, platinum, palladium, alloys thereof, derivatives thereof, or combinations thereof. A bulk layer formed as a portion of contact film 280 may be deposited, plated, or otherwise formed on or over the seed layer, cobalt oxide layer 230, crystalline cobalt film 240, metallic cobalt layer 250, or conductive metallic layer 260 during one or several deposition processes during step 180. The bulk layer, as a portion of contact film 280, may contain copper, tungsten, aluminum, titanium, alloys thereof, derivatives thereof, or combinations thereof. Usually, a seed layer and a bulk layer may independently contain copper, tungsten, aluminum, alloys thereof, derivatives thereof, or combinations thereof. A seed layer and a bulk layer may independently be deposited by using one or more deposition process, such as a CVD process, a PE-CVD process, an ALD process, a PE-ALD process, a PVD process, an electroless deposition process, an ECP process, derivatives thereof, or combinations thereof.

In one example, contact film 280 contains at least one seed layer and at least one bulk layer and each layer independently contains copper or a copper alloy. For example, a seed layer containing copper may be deposited on or over cobalt oxide layer 230, crystalline cobalt film 240, metallic cobalt layer 250, or conductive metallic layer 260 by a PVD process and thereafter, a bulk layer containing copper may be deposited to fill aperture 206 by an ECP process or an electroless deposition process. In another example, a seed layer containing copper may be deposited on or over cobalt oxide layer 230, crystalline cobalt film 240, metallic cobalt layer 250, or conductive metallic layer 260 by an ALD process and thereafter, a bulk layer containing copper may be deposited to fill aperture 206 by an ECP process or an electroless deposition process. In another example, a seed layer containing copper may be deposited on or over cobalt oxide layer 230, crystalline cobalt film 240, metallic cobalt layer 250, or conductive metallic layer 260 by a CVD process and thereafter, a bulk layer containing copper may be deposited to fill aperture 206 by an ECP process or an electroless deposition process. In another example, a seed layer containing copper may be deposited on or over cobalt oxide layer 230, crystalline cobalt film 240, metallic cobalt layer 250, or conductive metallic layer 260 by an electroless process and thereafter, a bulk layer containing copper may be deposited to fill aperture 206 by an ECP process or an electroless deposition process. In another example, metallic cobalt layer 250 or conductive metallic layer 260 serves as a seed layer to which a bulk layer containing copper may be directly deposited to fill aperture 206 by an ECP process or an electroless deposition process.

In one example, each of a seed layer and a bulk layer contains tungsten or a tungsten alloy. For example, a seed layer containing tungsten may be deposited on or over cobalt oxide layer 230, crystalline cobalt film 240, metallic cobalt layer 250, or conductive metallic layer 260 by a PVD process and thereafter, a bulk layer containing tungsten may be deposited to fill aperture 206 by a CVD process or a pulsed-CVD process. In another example, a seed layer containing tungsten may be deposited on or over cobalt oxide layer 230, crystalline cobalt film 240, metallic cobalt layer 250, or conductive metallic layer 260 by an ALD process and thereafter, a bulk layer containing tungsten may be deposited to fill aperture 206 by a CVD process or a pulsed-CVD process. In another example, a seed layer containing tungsten may be deposited on or over cobalt oxide layer 230, crystalline cobalt film 240, metallic cobalt layer 250, or conductive metallic layer 260 by a pulsed-CVD process and thereafter, a bulk layer containing tungsten may be deposited to fill aperture 206 by a CVD process or a pulsed-CVD process. In another example, a seed layer containing tungsten may be deposited on or over cobalt oxide layer 230, crystalline cobalt film 240, metallic cobalt layer 250, or conductive metallic layer 260 by an electroless process and thereafter, a bulk layer containing tungsten may be deposited to fill aperture 206 by a CVD process or a pulsed-CVD process. In another example, metallic cobalt layer 250 or conductive metallic layer 260 serves as a seed layer to which a bulk layer containing tungsten may be directly deposited to fill aperture 206 by a CVD process or a pulsed-CVD process.

An ALD processing chamber used during embodiments described herein is available from Applied Materials, Inc., located in Santa Clara, Calif. A detailed description of an ALD processing chamber may be found in commonly assigned U.S. Pat. Nos. 6,878,206, 6,916,398, 7,682,946, 7,780,785, and 7,850,779, which are hereby incorporated by reference in their entirety. In another embodiment, a chamber configured to operate in both an ALD mode as well as a conventional CVD mode may be used to deposit cobalt-containing materials is described in commonly assigned U.S. Pat. No. 7,204,886, which is incorporated herein by reference in its entirety. A detailed description of an ALD process for forming cobalt-containing materials is further disclosed in commonly assigned U.S. Pat. Nos. 7,264,846 and 7,404,985, which are hereby incorporated by reference in their entirety. In other embodiments, a chamber configured to operate in both an ALD mode as well as a conventional CVD mode that may be used to deposit cobalt-containing materials is the TXZ® showerhead and CVD chamber available from Applied Materials, Inc., located in Santa Clara, Calif. An example of a suitable vapor deposition chamber includes the WXZ™ CVD chamber, commercially available from Applied Materials, Inc., located in Santa Clara, Calif. The vapor deposition chamber may be adapted to deposit materials by conventional CVD, pulsed-CVD, or PE-CVD techniques as well as by ALD and PE-ALD techniques. Also, the vapor deposition chamber may be used as for treatment processes, such as an in situ plasma process, a remote plasma process, or a thermal annealing process.

"Substrate surface" or "substrate," as used herein, refers to any substrate and/or material surface formed on a substrate upon which film processing is performed during a fabrication process. For example, a substrate or a substrate surface on which processing may be performed include, but not limited to, materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 100 mm, 200 mm, 300 mm, or 450 mm diameter wafers, as well as, rectangular or square panes. Unless otherwise noted, embodiments and examples described herein are usually conducted on substrates with a 200 mm diameter or a 300 mm diameter, such as, a 300 mm diameter. Processes of the embodiments described herein may be used to deposit cobalt materials (e.g., metallic cobalt or cobalt alloys) on many substrates and surfaces, especially, metallic layers, nitride layers, barrier layers, oxide layers, and other various layers. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pre-treatment process to polish, etch, reduce, oxidize, hydroxylate, heat, and/or anneal the substrate or substrate surface.

While the foregoing is directed to embodiments of the invention, other and further embodiments of the invention may be devised without departing from the basic scope thereof, and the scope thereof is determined by the claims that follow.

The invention claimed is:

1. A method for depositing materials on a substrate surface, comprising:
    forming a cobalt stack over a barrier layer disposed on a substrate by:
        depositing a cobalt layer during a deposition process;
        exposing the cobalt layer to a plasma to form a plasma-treated cobalt layer during a plasma process; and
        repeating the deposition process and the plasma process to form the cobalt stack, the cobalt stack comprising a plurality of plasma-treated cobalt layers; and
    heating the cobalt stack to a crystallization temperature within a range from about 300° C. to about 500° C. to form a crystalline cobalt film from the cobalt stack during a thermal annealing crystallization process.

2. The method of claim 1, wherein the cobalt stack comprises a carbon concentration of about 3 at% or less.

3. The method of claim 1, wherein the cobalt stack has a thickness within a range from about 80 Å to about 120 Å and has a resistivity within a range from about 20µΩ-cm to about 40 µΩ-cm.

4. The method of claim 1, wherein the cobalt stack has a thickness within a range from about 450 Å to about 750 Å and has a resistivity within a range from about 5µΩ-cm to about 20 µΩ-cm.

5. The method of claim 1, wherein the plurality of plasma-treated cobalt layers within the cobalt stack contain at least 3 plasma-treated cobalt layers and up to about 30 plasma-treated cobalt layers.

6. The method of claim 1, wherein the crystallization temperature is within a range from about 300° C. to about 425° C. for a time period within a range from about 5 minutes to about 60 minutes during the thermal annealing crystallization process.

7. The method of claim 1, further comprising exposing the cobalt stack to an oxygen source to form a cobalt oxide layer from an upper portion of the cobalt stack during a surface oxidation process.

8. The method of claim 7, wherein the cobalt oxide layer is disposed on the cobalt stack and has a thickness within a range from about 5 Å to about 30 Å.

9. The method of claim 7, wherein the substrate is heated to a temperature within a range from about 20° C. to about 500° C. for a time period of about 60 seconds or less during the surface oxidation process.

10. The method of claim 9, wherein the temperature is within a range from about 250° C. to about 350° C. and the time period is within a range from about 5 seconds to about 60 seconds during the surface oxidation process.

11. The method of claim 1, wherein each cobalt layer is deposited from a deposition gas comprising a cobalt source gas and hydrogen gas ($H_2$) during a thermal chemical vapor deposition process.

12. The method of claim 11, wherein the cobalt source gas is dicobalt hexacarbonyl butylacetylene (CCTBA).

13. The method of claim 1, wherein each cobalt layer is exposed to the plasma to form each plasma-treated cobalt layer during the plasma process, and the plasma comprises a reagent selected from the group consisting of ammonia ($NH_3$), hydrogen ($H_2$), an ammonia/hydrogen mixture, derivatives thereof, and combinations thereof.

14. The method of claim 13, wherein each cobalt layer is exposed to a hydrogen plasma for a time period within a range from about 10 seconds to about 180 seconds.

15. The method of claim 7, further comprising exposing the cobalt oxide layer to a hydrogen plasma to form a metallic cobalt layer from the crystalline cobalt film.

16. The method of claim 15, further comprising depositing a conductive metallic layer comprising a metal on the cobalt oxide layer and thereafter, heating the substrate to diffuse the metal of the conductive metallic layer into the cobalt oxide layer and the crystalline cobalt film.

17. A method for depositing materials on a substrate surface, comprising:
    forming a cobalt stack comprising a plurality of plasma-treated cobalt layers over a barrier layer disposed on a substrate by sequentially depositing and treating cobalt layers, wherein each cobalt layer is deposited from a deposition gas comprising a cobalt source gas and hydrogen gas ($H_2$) during a thermal chemical vapor deposition process and subsequently exposed to a plasma to form each of the plasma-treated cobalt layers during a plasma process; and heating the cobalt stack to a crystallization temperature to form a crystalline cobalt film during a thermal annealing crystallization process.

18. The method of claim 17, further comprising exposing the cobalt stack to an oxygen source to form a cobalt oxide layer from an upper portion of the cobalt stack during a surface oxidation process.

19. A method for depositing materials on a substrate surface, comprising:

forming a cobalt stack over a barrier layer disposed on a substrate by:
depositing a cobalt layer during a deposition process;
exposing the cobalt layer to a plasma to form a plasma-treated cobalt layer during a plasma process; and
repeating the deposition process and the plasma process to form the cobalt stack, the cobalt stack comprising a plurality of plasma-treated cobalt layers;

heating the cobalt stack to a crystallization temperature to form a crystalline cobalt film during a thermal annealing crystallization process;

depositing a conductive metallic layer on the crystalline cobalt film, wherein the metal of the conductive metallic layer comprises a metal selected from the group consisting of aluminum, copper, titanium, alloys thereof, and combinations thereof; and heating the substrate while diffusing the metal of the conductive metallic layer into the crystalline cobalt film.

20. The method of claim 19, further comprising exposing the cobalt stack to an oxygen source to form a cobalt oxide layer during a surface oxidation process, wherein a thickness of the cobalt oxide layer is within a range from about 10 Å to about 20 Å, a temperature is within a range from about 250° C. to about 350° C., and a time period is within a range from about 5 seconds to about 60 seconds during the surface oxidation process.

* * * * *